United States Patent
Van der Velden et al.

(10) Patent No.: US 10,769,325 B2
(45) Date of Patent: Sep. 8, 2020

(54) SIMULATION AUGMENTED REALITY SYSTEM FOR EMERGENT BEHAVIOR

(71) Applicant: Dassault Systemes Simulia Corp., Johnston, RI (US)

(72) Inventors: Alexander Jacobus Maria Van der Velden, Atlanta, GA (US); Robert Vincent Combier, Dahlonega, GA (US)

(73) Assignee: DASSAULT SYSTEMES SIMULIA CORP., Johnston, RI (US)

( * ) Notice: Subject to any disclaimer, the term of this patent is extended or adjusted under 35 U.S.C. 154(b) by 0 days.

(21) Appl. No.: 16/825,605

(22) Filed: Mar. 20, 2020

(65) Prior Publication Data
US 2020/0218839 A1     Jul. 9, 2020

Related U.S. Application Data

(63) Continuation of application No. 15/096,887, filed on Apr. 12, 2016, now Pat. No. 10,628,537.

(51) Int. Cl.
*G06F 30/20* (2020.01)
*G06T 19/00* (2011.01)

(52) U.S. Cl.
CPC ............ *G06F 30/20* (2020.01); *G06T 19/006* (2013.01); *G06T 2210/61* (2013.01)

(58) Field of Classification Search
CPC ...... G06F 30/20; G06F 17/50; G06F 17/5009; G06T 19/006; G06T 2210/61
See application file for complete search history.

(56) References Cited

U.S. PATENT DOCUMENTS

| | | |
|---|---|---|
| 7,050,955 B1 | 5/2006 | Carmel et al. |
| 7,284,984 B1 | 10/2007 | Zyskowski |
| 7,991,593 B2 | 8/2011 | Olsen et al. |
| 8,112,254 B1 | 2/2012 | Bhat et al. |
| 8,788,574 B2 | 7/2014 | Beckman et al. |
| 8,831,926 B2 | 9/2014 | Van der Velden |
| 2005/0049838 A1 | 3/2005 | Danko |
| 2005/0171745 A1 | 8/2005 | Breitfeld et al. |

(Continued)

FOREIGN PATENT DOCUMENTS

| | | |
|---|---|---|
| CN | 104299259 A | 1/2015 |
| WO | 2006088429 A1 | 8/2006 |
| WO | 2010022762 A2 | 3/2010 |

OTHER PUBLICATIONS

Azuma, Ronald et al., "Recent Advances in Augmented Reality," IEEE Computer Graphics and Applications, New York, NY, vol. 21, No. 6, Dec. 1, 2001, pp. 34-46.

(Continued)

*Primary Examiner* — Brian W Wathen
(74) *Attorney, Agent, or Firm* — Armstrong Teasdale LLP

(57) ABSTRACT

Embodiments of the present invention provide an augmented reality by defining a model representing a real-world system. After defining the model, a plurality of model simulations are performed using the defined model which produce predicted field data that is stored in memory. In turn, data from one or more sensors in the real-world system is received and the defined model is calibrated using the received field data relative to the stored predicted field data. Then, an augmented reality of the real-world system is provided using the calibrated model.

20 Claims, 6 Drawing Sheets

(56) References Cited

U.S. PATENT DOCUMENTS

| | | | |
|---|---|---|---|
| 2007/0043622 | A1 | 2/2007 | Olsen et al. |
| 2008/0181303 | A1 | 7/2008 | Andam et al. |
| 2008/0228744 | A1 | 9/2008 | Desbiens |
| 2010/0019741 | A1 | 1/2010 | Ketteler et al. |
| 2010/0240988 | A1* | 9/2010 | Varga .................. G06F 3/011 600/425 |
| 2011/0024125 | A1 | 2/2011 | Wallace et al. |
| 2013/0158966 | A1 | 6/2013 | Baek et al. |
| 2013/0304440 | A1 | 11/2013 | Van der Velden |
| 2014/0267228 | A1 | 9/2014 | Ofek et al. |
| 2014/0274373 | A1 | 9/2014 | Olshan et al. |
| 2016/0179992 | A1 | 6/2016 | Van Der Velden |
| 2016/0314621 | A1 | 10/2016 | Hill et al. |
| 2017/0169142 | A1 | 6/2017 | Van der Velden |
| 2017/0178013 | A1 | 6/2017 | Beloglazov et al. |
| 2017/0277166 | A1 | 9/2017 | Popa-Simil et al. |
| 2017/0293705 | A1 | 10/2017 | Van der Velden et al. |

OTHER PUBLICATIONS

Bahar et al., "Simulation and Visualization of Thermal Metaphor in a Virtual Enviornment for Thermal Building Assessment" (2014), International Journal of Technology, vol. 5, No. 1, pp. 3-13 [retrieved from http://sam.ensam.eu/handle/10985/9135].

Banomyong et al., "Using Monte Carlo simulation to refine emergency logistics response models: a case study" (2010), International Journal of Physical Distribution & Logistics Management, vol. 40, No. 8/9, pp. 709-721 [retrieved from https:// search.proquest.conn/docview/763663152].

Crowell, A.R. et al., "Surrogate Based Reduced-Order Acrothermodynamic Modeling for Structural Response Prediction at High Mach Numbers," 52nd AIAA/ASME/ASCE/AHS/ASC Structures, Structural Dynamics and Materials Conference, Apr. 2011 (26 pages).

Deng, Jian, "Structural reliability analysis for implicit performance function using radial basis function network." International Journal of Solids and Structures 43.11-12 (2006): 3255-3291. (Year: 2006).

Deshmukh AP, Allison JT, "Design of Nonlinear Dynamic Systems Using Surrogate Models of Derivative Functions". ASME. International Design Engineering Technical Conferences and Computers and Information in Engineering Conference, vol. 38: 39th Design Automation Conference():V03BT03A011. doi:1 0.1115/DETC2013-12262, Aug. 2013.

Design of Experiments—Wikipedia, Dec. 2003, retrieved from the Internet URL: http://en.wikipedia.org/wiki/Design_of experiments.

EP Extended Search Report for related application 17164711.8 dated Sep. 18, 2017; 10 pp.

European Search Report for EP Application No. 15201084.9, titled: Interactive 3D Experiences on the Basis of Data, Date of Completion: Feb. 25, 2016.

Extended European Search Report for Application No. 16204088.5; Dassault Systemes Simulia Corp.; dated May 12, 2017; 7 pages.

Finite Element Analysis—FEA and Simulation Software—SIMULIA—Dassault Systemes, Jul. 2013, Retrieved from the Internet URL: http://www.3ds.com/products-services/simulia/overview/.

Finney "FARSITE: Fire Area Simulator-Model Development and Evaluation" (Feb. 2004), pp. 1-47 [retrieved from https:// www.fs.fed.us/rm/pubs/rmrs_rp004.pdf].

Fraunhofer SCAI: FEMZIT, Oct. 2013, Retrieved from the Internet URL: http://www.scai.fraunhofer.de/geschaeftsfelder/numerische-software/produkte/femzip.html?&L=1.

Functional Mock-up Interface (FMI) website, Jul. 2015 (Functional Mock-up Interface 1.0 available on Jan. 2010), retrieved from the Internet URL: http://www.fini-standard.org/start.

Functional Mock-up Interface for Model Exchange, version 1.0, Jan. 2010, MODELISAR (07006), retrieved from the Internet URL: https ://svn.modelica. org/fmi/branches/public/sp e cifications/vl. 0/FMI_for ModelExchange v1.0 .p df, 56 pages.

Hardy, Rolland L., "Multiquadratic Equations of Topography and Other Irregular Surfaces," J. Geophysics Res., 76(8): 1905-1915, Mar. 1971.

Higdon et al., "Combining Field Data and Computer Simulations for Calibration and Prediction" (2004), SIAM J. Sci. Comput., vol. 26, No. 2, pp. 448-466 [retrieved from https://www2.stat.duke.edu/courses/Spring14/sta961.01/ref/HigdKennEtal2004.pdf].

Jolliffe, I.T., "Principal Component Analysis," Series: Springer Series in Statistics, 2nd ed., Springer, NY, p. 1-6, (table of contents included only), Oct. 2002.

Kennedy et al., "Bayesian Calibration of Computer Models" J.R. Statist. Soc. B, vol. 63, Part 3, pp. 425-464 [retrieved from https://rss.onlinelibrary.wiley.com/doi/abs/10.1111/1467-9868.00294] (Year 2001).

Klein, Vladislav, and Murphy, Patrick C., "Aerodynamic Parameters of High Performance Aircraft Estimated from Wind Tunnel and Flight Test Data," NASA-98-AGARD, p. 18-1 through 18-20, May 1998.

Lang, Yi-Dong, et al. "Reduced order model based on principal component analysis for process simulation and Optimization." Energy & Fuels 23.3 (2009): 1695-1706. (Year 2009).

Microsoft, "Why Microsoft HoloLens," https://www.microsoft.comimicrosoft-hololensien-us/why-hololens, retrieved from the Internet Apr. 28, 2016, 15 pages.

Optimal design—Wikipedia, Dec. 2005, Retrieved from the Internet URL: http://en.wikipedia.org/wiki/Optimal_design.

Pugnet et al., "Wildland-urban interface (WUI) fire modelling using PHOENIX Rapidfire: A case study in Cavaillon, France" (Jan. 2013), pp. 228-234 [retrieved from https://www.researchgate.net/publication/273699623].

Qian, Z. et al., "Building Surrogate Models Based on Detailed and Approximate Simulations," Journal of Mechanical Design, vol. 128, pp. 668-675 (Jul. 2006).

Response surface methodology—Wikipedia, Sep. 2006, Retrieved from the Internet URL: https://en.wikipedia.org/wiki/Response surface methodology.

Roth-Tabak, Yuval et al., "Building an Environment Model Using Depth Information," IEEE Computer Society, vol. 22, No. 6, Jun. 1, 1989, pp. 85-90.

Sirovich L., "Turbulence and the Dynamics of Coherent Structures, Part 1, Coherent Structures," Quart. Appl. Math., 45(3):561-571 (1987).

Sirovich L., "Turbulence and the Dynamics of Coherent Structures, Part II, Symmetries and Transformations," Quart. Appl. Math., 45(3):573-582 (1987).

Sirovich L., "Turbulence and the Dynamics of Coherent Structures, Part III, Dynamics and Scaling," Quart. Appl. Math., 45(3):583-590 (1987).

Soil Conservation Service, "TR-20 Computer program for project formulation hydrology" (Feb. 1992), pp. 1-330 [retrieved from https ://www.nrcs.usda.gov/Internet/FSE DOCUMENTS/stelprdb1044168.pdf].

T. Blochwitz, M. Otter, M. Arnold, C. Bausch, C. GlauB, H. Elmqvist, A. Junghanns, J. Mauss, M. Monteiro, T. Neidhold, D. Neumerkel, H. Olsson, J.-V. Peetz, S. Wolf, "The Functional Mockup Interface for Tool independent Exchange of Simulation Models". Proceedings of the 8th Modelica Conference, Dresden, Germany, Mar. 20-22, 2011.

Tuceryan, Mihran et al., "Calibration Requirements and Procedures for a Monitor-Based Augmentd Reality System," IEEE Transactions on Visualization and Computer Graphics, Los Alamitos, CA, vol. 1, No. 3, Sep. 1, 1995, 19 pp.

Van der Velden, A., Koch, P., Devanathan, S., Haan, J., Nachring, D., and Fox, D., "Probabilistic Certificate of Correctness for Cyber Physical Systems," ASME 2012 International Design Engineering Technical Conferences & Computers and Information in Engineering Conference, Aug. 12-15, Chicago, IL, USA, DETC2012-70135, Aug. 2012.

VRML97 The Virtual Reality Modeling Language, International Standard ISO/IEC 14772-1:1997, The VRML Consortium Incorporated, (1997).

(56) References Cited

OTHER PUBLICATIONS

Queipo, N.V. et al.,"Surrogate-based analysis and optimization", Progress in Aerospace Sciences, Oxford, GB; vol. 41, No. 1, Jan. 1, 2005, pp. 1-28.
DSSC2015-04 EPO Form 2906.

\* cited by examiner

SIMULATION AUGMENTED REALITY SYSTEM FOR EMERGENT BEHAVIOR

CROSS-REFERENCE TO RELATED APPLICATIONS

This application is a continuation of U.S. patent application Ser. No. 15/096,887, filed 12 Apr. 2016, entitled "SIMULATION AUGMENTED REALITY SYSTEM FOR EMERGENT BEHAVIOR," the entire contents and disclosure of which is hereby incorporated herein by reference in their entireties.

BACKGROUND

Embodiments of the invention generally relate to the field of computer programs and systems and specifically to the fields of product design and simulation and augmented and virtual reality. Embodiments may be employed in virtual reality, design, e.g. engineering system design, maintenance, augmented reality, systems operations, virtual presentations, and entertainment, e.g., video games and movies.

A number of existing product and simulation systems are offered on the market for the design and simulation of systems, parts, or assemblies of parts. Such product and simulation systems typically employ computer aided design (CAD) and/or computer aided engineering (CAE) programs. These systems allow a user to construct, manipulate, and simulate complex three-dimensional models of objects or assemblies of objects. These CAD and CAE systems thus, provide a representation of modeled objects using edges or lines, in certain cases with faces. Lines, edges, faces, or polygons may be represented in various manners, e.g. non-uniform rational basis-splines (NURBS).

These CAD systems manage parts or assemblies of parts of modeled objects, which are mainly specifications of geometry. In particular, CAD files contain specifications, from which geometry is generated. From geometry, a representation is generated. Specifications, geometries, and representations may be stored in a single CAD file or multiple CAD files. CAD systems include graphic tools for representing the modeled objects to designers; these tools are dedicated to the display of complex objects. For example, an assembly may contain thousands of parts. A CAD system can be used to manage models of objects, which are stored in electronic files.

The advent of CAD and CAE systems allows for a wide range of representation possibilities for objects. Examples include finite element models (FEM), finite volume models, and lattice Boltzmann models (finite particle models). These models may be derived from a CAD model, and thus, may represent one or more parts or an entire assembly. Further, said models may be programmed in such a way that the model has the properties of the underlying object or objects that it represents. When a FEM or other such object representation as is known in the art is programmed in such a way, it may be used to perform simulations of the object that it represents. For example, a FEM may be used to represent the interior cavity of a vehicle, the acoustic fluid surrounding a structure, and any number of real-world objects. Moreover, CAD and CAE systems along with FEMs, finite volume models, and lattice Boltzmann models can be utilized to simulate engineering systems. For example, CAE systems can be employed to simulate noise and vibration of vehicles.

SUMMARY OF THE INVENTION

The existing simulation/experiment techniques are not without their drawbacks. A primary issue with such existing methodologies is the time they take to execute. Such amount of time prevents the existing methods from being practical methodologies, for example, to be used in virtual reality and real-time applications.

Embodiments of the present invention overcome problems with existing methodologies and provide methods and systems that provide an augmented reality experience in real time. Embodiments of the invention can be leveraged to improve methods in various fields, including virtual reality, video games, virtual presentations, and systems design, maintenance, and operations.

According to at least one example embodiment, a method for providing an augmented reality experience begins by defining, in computer memory, a model of a real-world system. Such a method continues by performing a plurality of simulations of the real-world system using the defined model to produce predicted field data, which are subsequently stored in computer memory. Next, field data is received from one or more sensors in the real-world system and the model of the real-world system is calibrated relative to the stored predicted field data using the field data received from the one or more sensors. In turn, an augmented reality of the real-world system is provided using the calibrated model of the real-world system.

According to an example embodiment, defining the model of the real-world system includes defining one or more model parameters. In such an embodiment, calibrating the model of the real-world system using the received field data includes determining values of the one or more model parameters given the received field data. Yet another embodiment performs the plurality of simulations for one or more variations of the one or more model parameters. Such a method embodiment may further store the one or more variations of the one or more model parameters used in performing the plurality of simulations.

An alternative embodiment of the method further comprises (1) predicting one or more points of failure of the real-world system by performing a simulation of the real-world system using the calibrated model and (2) indicating the one or more predicted points of failure in the augmented reality. In an example embodiment, the augmented reality is provided via an augmented reality headset. In yet another embodiment, providing the augmented reality includes illustrating a state of the real-world system at a future time. In such an embodiment, the state of the real-world system at a future time may be determined using one or more counter-example studies. Further, according to an embodiment, illustrating the state of the real-world system at a future time depicts at least one of: the real-world system if no action is performed, the real-world system if a user proposed action is performed, and the real-world system if a system recommended action is performed.

In yet another example embodiment, the performed plurality of simulations, simulate one or more emergent behaviors of the real-world system. Further, according to another embodiment, the augmented reality illustrates physical field data and/or predicted future physical field data of the real-world system determined using the calibrated model. In such an embodiment, the physical field data may include at least one of: temperature, density, gas flow, probable fracture location, likelihood of fracture, velocity, stress, and strain, amongst others.

Another embodiment of the present invention is directed to a computer system for providing an augmented reality experience. Such a computer system comprises a processor and a memory with computer code instructions stored thereon, where the processor and the memory with the computer code instructions are configured to cause the system to define a model of a real-world system in computer system memory. Further, the processor and the memory, with the computer code instructions, may be further configured to cause the computer system to perform a plurality of simulations of the real-world system using the defined model to produce predicted field data, which is stored in computer memory. Moreover, the computer system, in response to field data received from one or more sensors in the real-world system, calibrates the model of the real-world system, using the received field data, relative to the predicted field data, and provides an augmented reality of the real-world system using the calibrated model of the real-world system.

According to an embodiment of the computer system, defining the model of the real-world system includes defining one or more model parameters. In such an embodiment, calibrating the model of the real-world system using the received field data includes determining values of the one or more model parameters given the received field data. Further still, in such an embodiment, the plurality of simulations may be performed for one or more variations of the one or more model parameters.

In an alternative embodiment of the system, the processor and the memory, with the computer code instructions, are further configured to cause the system to (1) predict one or more points of failure of the real-world system by performing a simulation of the real-world system using the calibrated model and (2) indicate the one or more predicted points of failure in the provided augmented reality. Yet another system embodiment provides the augmented reality via an augmented reality headset. Further, an alternative embodiment of the system illustrates a state of the real-world system at a future time in the provided augmented reality.

Another embodiment of the present invention is directed to a cloud computing implementation for providing an augmented reality experience. Such an embodiment is directed to a computer program product executed by a server in communication across a network with one or more clients, where the computer program product comprises a computer readable medium. In such an embodiment, the computer readable medium comprises program instructions which, when executed by a processor, causes: defining in computer memory, a model of a real-world system and performing a plurality of simulations of the real-world system using the defined model where performing the plurality of simulations produces predicted field data. Such program instructions, when executed, further cause storing the predicted field data and receiving field data from one or more sensors in the real-world system. Moreover, in such an embodiment, the program instructions, when executed by the processor, further cause: calibrating the model of the real-world system using the received field data relative to the predicted field data and providing an augmented reality of the real-world system using the calibrated model of the real-world system.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

Figure 1:
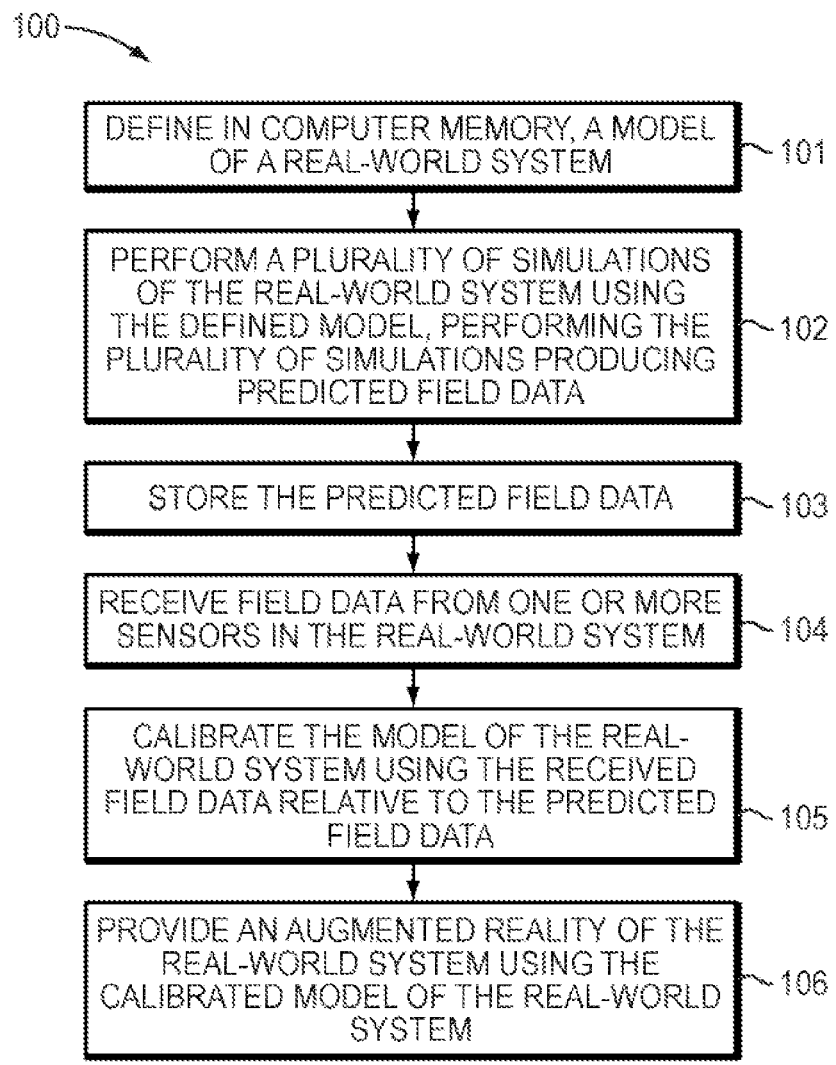
FIG. 1 is a flowchart of a computer implemented method for providing an augmented reality experience according to at least one example embodiment.

A description of example embodiments of the invention follows.

The teachings of all patents, published applications, and references cited herein are incorporated by reference in their entirety.

Embodiments of the present invention provide augmented realities for real-world systems. Methods and systems of the present invention can be leveraged to improve outcomes when users encounter emergent behaviors, i.e., previously un-experienced system behaviors. Emergency response for complex plants, facilities, systems, and equipment is usually based on emergency procedures for which employees receive manuals and training. Such existing methods work relatively well if a system has only a few behavioral states that can be readily observed using a few sensors, and if these states can be more or less linearly controlled with actuators influencing specific components.

However, with the advent of cyber physical systems, the overall behavior of a system can be quite different than the sum of the behavior of each component, e.g., non-linear. Properties of these increasingly complex systems cannot be understood by studying the behavior of the components alone, and instead, one must understand not only the components of the system individually, but also, the interactions between the components. Conventional methods cannot train employees and users on all of these possible interactions and behaviors.

Embodiments of the present invention solve the foregoing problems by providing methods and systems that provide an augmented reality of a real-world system. Such methods can be used in performing training exercises and can further be utilized in real-time to improve decision making and outcomes. In order to provide such capabilities, embodiments leverage a model of the real-world system, i.e., a "digital twin" having a variety of model parameters that define properties of the real-world system and a large number of simulations of the real-world system that have been performed using the defined model. The defined model and simulations are used to identify the real-world system and its various interactions. Such simulations can include design of experiments studies or counterexample studies as described in U.S. Pat. No. 8,831,926 B2, the contents of which are herein incorporated by reference. After defining the model and performing the plurality of simulations with said model, embodiments may, in turn, store in memory and compress the model parameters used in performing these simulations and the field data resulting from said simulations for further use. According to one such example embodiment, the model parameters and field data are compressed using a virtual/augmented reality authoring method, such as U.S. patent application Ser. No. 14/969,341, the contents of which are herein incorporated by reference, which can be leveraged to predict the field data in real time as a function of the model parameters. In operation, according to an embodiment, discrete sensors at fixed locations stream values to the augmented reality system which, in response, determines the model parameters using a numerical calibration, such as error minimization, to match the predicted behavior (which was determined using the plurality of simulations) to the streaming measured behaviors. Having determined the appropriate model parameters, the augmented reality system can now project the behavior of the real-world system, determined using the model parameters, on the physical world using a commercially available augmented reality headset such as the Microsoft® HoloLens. It is also possible to visually indicate the location of likely failure modes (what real-world components are not working as intended) and to predict a state of the real-world system at a future time under various scenarios, e.g., no action, a user proposed action, a computing system recommended action to take in the real-world system, etc.

Such an augmented reality system can reduce the effects of compounded human errors and can accelerate situational awareness of non-visible properties, e.g., temperature, density, gas flow, material stresses, strain energy, and probable fracture location and likelihood, during emergent behavior of real-world systems. These capabilities can help to avoid physical catastrophic failures.

FIG. 1 is a flow chart of a method 100 for providing an augmented reality experience according to an embodiment of the present invention. The method 100 begins at step 101 by defining, in computer memory, a model of a real-world system or object. According to an embodiment of the method 100, the model is defined in response to user interaction. For example, the user may define/construct the model and provide a variety of data regarding the real-world system/object that the model represents using techniques known in the art. This may include programming the model in such a way that it conforms to all of the parameters of a real-world system and can function as an operational model of the real-world system, i.e., a digital twin of the real-world system. For instance, the model may be programmed to have any properties of the real-world system that the model represents, such as dimensions, mass, and stiffness of the represented real-world system, amongst other examples. The model may be any model known in the art that can be programmed accordingly to be used in a simulation. In other words, according to an embodiment, the model may represent a behavior of said real-world system. Example models include a computer aided engineering (CAE) model, a finite element model, a finite volume model, a computational fluid dynamics model, and a multibody dynamics model. Further, the defined model may also be in the form of an equation or system of equations that can represent the various properties of the real-world system that the model represents. Examples include algebraic equations, ordinary differential equations, and partial differential equations. In one such embodiment of the present invention, the defined model is an approximate model of the real-world system. Further, in an embodiment, the model may be defined according to the principles described in U.S. application Ser. No. 14/969,341, such that the model can be used in simulations to quickly determine behaviors of the real-world system.

According to an example embodiment, defining the model at step 101 includes defining one or more model parameters. These parameters may include any such properties of the real-world system that is subject to the method. Examples include time, dimensions, materials, force, pressure loads, temperature, velocity, model configurations, system control settings, boundary conditions (how the geometry connects), the aforementioned prescribed conditions as a function of time, and any other system properties known to those of ordinary skill in the art.

After defining the model at step 101, a plurality of simulations of the real-world system are performed at step 102 using the defined model. In an embodiment, performing the plurality of simulations at step 102 produces predicted field data. To illustrate, consider an example where the real-world system is a server room, the model of the server room is defined at step 101, and a plurality of simulations of the server room are performed at step 102. Such an embodiment produces field data, such as temperature in the room, under various different operating conditions of the servers. In an embodiment where defining the model includes defining one or model parameters, performing the plurality of simulations of the real-world system at step 102 includes performing the simulations for different values of the defined model parameters. For example, a first simulation may be performed where the defined model parameters include an outside temperature of 32° F., a temperature at a first location in the server room of 64° F., a temperature of a second location in the server room of 70° F., and two servers transferring data at a rate of 30 megabytes per second. A second simulation can be performed where the aforementioned model parameters are the same, except now, four servers are transferring data at a rate of 50 megabytes per second. These two simulations each produce respective field data which, for example, may include the temperatures at all locations in the server room given the aforementioned operating conditions. According to an embodiment of the method 100, the simulations performed at step 102 may be performed according to principles known in the art. Further, in an embodiment, the simulations are performed according to principles described in U.S. patent application Ser. No. 14/969,341. Embodiments may leverage realistic simulation results that are typically used to predict system failure during the design and development of systems. Moreover, embodiments may also perform simulations that include design of experiments studies or counterexample studies as described in U.S. Pat. No. 8,831,926 B2. Further, in one such example embodiment of the method 100, one or more simulations of emergent behavior of the real-world system are performed. In an embodiment, the simulations are performed using an existing simulation platform, such as Abaqus® which is available from Dassault Systemes Simulia Corporation. According to an embodiment, the number of simulations performed depends on the desired accuracy of the predicted field data and the complexity of the simulation. In such an embodiment, the accuracy of the predicted field data can be determined through cross-validation or through use of a separate validation set.

The method 100 continues at step 103 and stores in computer memory the predicted field data that results from the plurality of simulations performed at step 102. In an embodiment, the model parameters and various values of the model parameters that were used in performing the simulations are also stored in computer memory. The predicted field data may be stored at step 102 via any means know in the art on any storage device known in the art. Further, in an embodiment, the data may be stored in a compressed form using a virtual/augmented reality authoring method, such as the method described in U.S. patent application Ser. No. 14/969,341. For instance, in such an embodiment, the predicted field data may be compressed to one or more interpolants that each include discrete polytope bins with continuous surrogates of respective behaviors of the real-world system. These interpolants can in turn be calibrated in step 105 to field data received at step 104 from one or more sensors and used to provide an augmented reality in step 106, described herein below. According to an embodiment where the model defined at step 101 is an approximate model, the predicted field data may be considered part of the model of the real-world system and, thus, storing in computer memory the predicted field data at step 103 may be considered updating and storing the approximate state model (in memory) of the real-world system using the predicted field data. In such an embodiment, the approximate state model may be stored in computer memory as described in U.S. patent application Ser. No. 14/969,341 such that the model is given by one or more interpolants that each include discrete polytope bins with continuous surrogates of respective behaviors of the real-world system. Further, according to such an embodiment, the model of the real-world system includes the model defined at step 101 along with the predicted field data stored in computer memory at step 103.

According to one such example embodiment, the aforementioned steps of the method 100, steps 101-103, are performed prior to when a user would like to utilize the augmented reality provided by the method 100. This example embodiment allows the augmented reality to be provided with minimized latency. Further, such an embodiment may be particularly advantageous when the augmented reality is used in emergency situations because the augmented reality can be provided as quickly as possible.

The method 100 continues by receiving field data from one or more sensors in the real-world system at step 104. To illustrate, returning to the aforementioned server room example, a temperature sensor from the first location in the server room may transmit temperature data to a computing system implementing the method 100 at step 104. Thus, in an embodiment, the field data received at step 104 may be a limited number of data points, e.g., one or two temperatures from points in a room, as in the aforementioned example.

Next, the method 100 calibrates the model of the real-world system using the received field data relative to the predicted field data at step 105. In an embodiment, calibrating the model at step 105 determines the various properties of the model given the received field data. For example, if a temperature reading of 70° F. for a given point of the real-world system is received at step 104, at step 105, the characteristics of the model that yield a temperature of 70° F. for that given point in the real-world system are determined. Thus, in an embodiment, calibrating the model of the real-world system at step 105 may include determining values of the one or more model parameters given the received field data. According to an embodiment, this may be performed using the stored predicted field data of 103 and/or variations of the model parameters. For instance, the stored data of 103 may be interpolated and/or extrapolated to determine the characteristics of the model. In one such example embodiment, the model characteristics are determined using a process of numerical calibration, such as error minimization, to match the predicted behavior to the field data received from the one or more sensors. In an embodiment where the stored model is given by one or more interpolants that each include discrete polytope bins with continuous surrogates of respective behaviors of the real-world system, calibrating the model at step 105 includes optimizing the inputs of the surrogate model such that its outputs match the real-world sensor values. Further, in an embodiment, the calibration performed at step 105 can use other machine learning models.

This calibrating methodology helps to eliminate the need for a large plurality of sensors in the real-world system. For instance, it is theoretically possible to fully populate the real-world system with sensors so as to measure all of the various properties and characteristics of the system. However, such a system is cost prohibitive, extremely complex, and would interfere with spatial access (such a system would likely require sensors in the majority of the free space). Advantageously, the method 100 can rely on a limited number of sensors, the previously performed simulations, and stored data, to determine the various properties of the entire system with only the limited amount of real-world data.

Given the calibrated model, the method 100 continues and provides an augmented reality of the real-world system using the calibrated model of the real-world system. Thus, in operation, a user in the real-world system can have her reality augmented with a variety of visualizations determined using the calibrated model. This augmented reality may be determined in real time using the calibrated model to make predictions of behavior that are illustrated in the augmented reality. For example, the augmented reality may illustrate physical field data of the real-world system using the calibrated model. Such data, for instance, temperature, stress, strain, velocity, density, gas flow, material stresses, strain energy, probable fracture location and likelihood, can be illustrated to the user. In an example, an engineer looking at a bridge can see the stresses at various locations on the bridge through use of shading and/or labels. In such an example, for instance, highly stressed components would be overlaid with red shading while less stressed components are overlaid with yellow shading. Thus, when looking at the bridge, the augmented reality would show the various conditions of the bridge. An example of such operation is described herein below in relation to FIG. 4.

In an embodiment of the method 100, the augmented reality is provided at step 106 in real time using a commercially available holographic augmented reality headset, such as the Microsoft® HoloLens. In such an embodiment, the behavior of the system can be projected on the real-world. A further embodiment of the method 100 predicts one or more points of failure of the real-world system by performing a simulation of the real-world system using the calibrated model, and, in turn, indicates the one or more predicted points of failure in the augmented reality. Alternatively, an embodiment may leverage previously performed simulation results to illustrate predicted points of failure. Yet another embodiment illustrates a state of the real-world system at a future time. For instance, such an embodiment may depict future critical scenarios, e.g., component and device failures. In such an embodiment, the state of the real-world system at a future time may be determined using counterexample studies as described in U.S. Pat. No. 8,831,926. Such an embodiment, utilizes counterexamples in a verification approach to identify the nearest failure condition to the current state of the real-world system. In such an example embodiment, the nearest failure condition in the state space of the model is identified. Similarly, an embodiment may depict the real-world system if no action is performed, if a user proposed action is performed, and/or if a system recommended action is performed. In an embodiment, such future actions may be illustrated automatically, or in response to a user request. According to an embodiment, upon calibrating the model at step 105, the method 100 performs further simulations or leverages previously performed simulations in order to develop a recommended action or course of actions. In one such example, a simulation is performed that identifies a failure at a future time and, in response, the augmented reality system performs further simulations to identify actions that can be taken to avoid this predicted failure. These actions can then be illustrated (visually or graphically displayed) to the user in the augmented reality at step 106.

According to an embodiment, the augmented reality illustrates one or more emergent behaviors of the real-world system, i.e., a behavior that has not been previously experienced. Yet another embodiment of the method 100 further includes updating the model defined at step 101 with new behavior scenarios when new components or software are introduced to the real-world system. Such an embodiment updates the model at step 101, performs the simulations with the updated model at step 102, and then stores this new data in computer memory at step 103.

Figure 2:
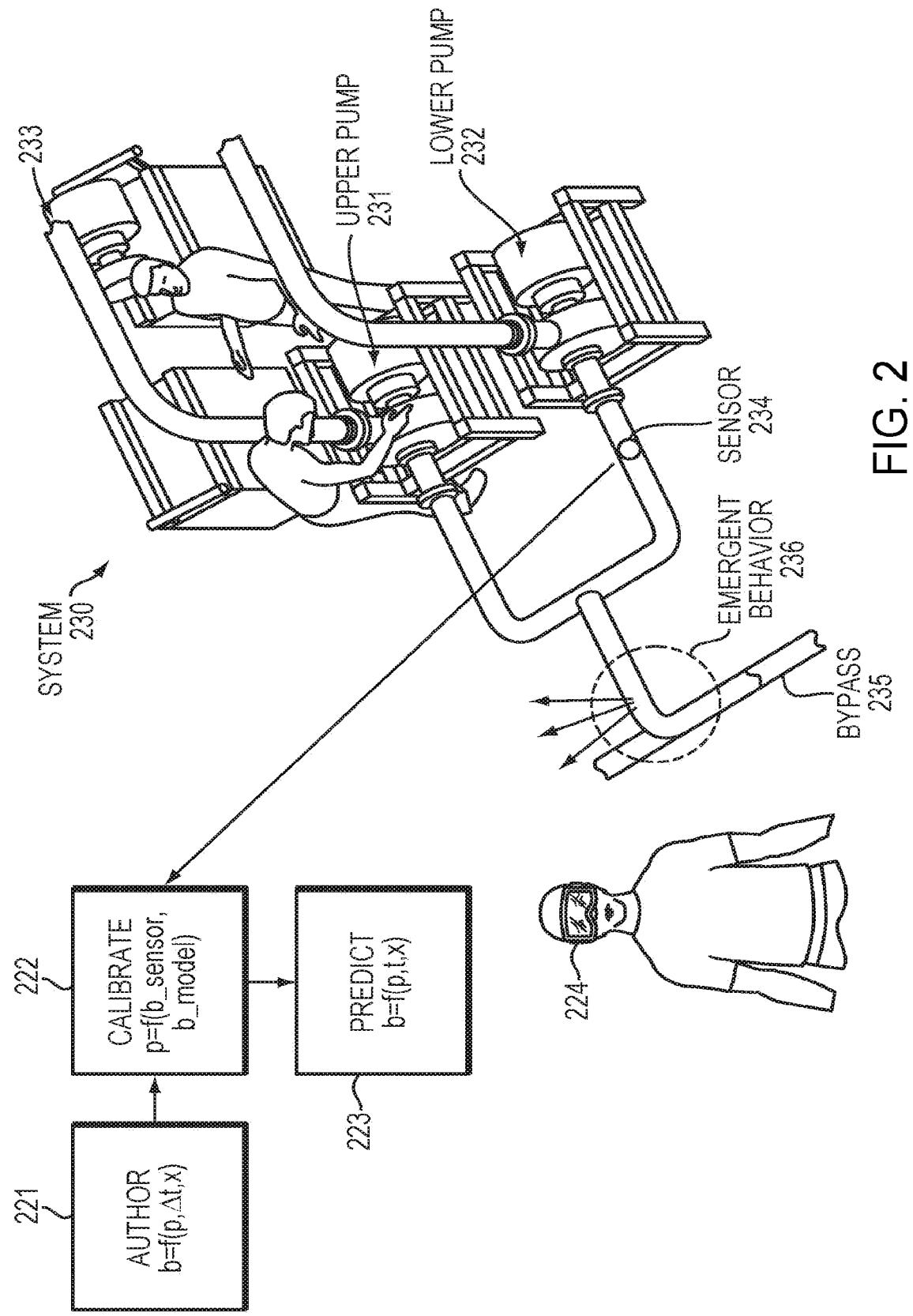
FIG. 2 illustrates an implementation of an embodiment for providing an augmented reality experience according to principles of the present invention.

FIG. 2 depicts an implementation of providing an augmented reality according to an embodiment of the present invention. Such an embodiment begins at virtual reality authoring system 221 which compresses data from simulations of the real-world system 230 that have been performed using the model b=f(p,Δt,x,c), where b is behavior of the model, p is one or more model parameter, t is time, x is position of one or more points in the real-world system, and c is a configuration of one or more model parameters. The model of the real-world system 230 and the data compressed at 221 allow the implementation shown in FIG. 2 to generate predicted field data 223 (e.g., temperature, pressure, stress, velocity) of behavior b anywhere in the real-world system 230 at a relative time (Δt). In the real-world system 230, one or more sensors 234 stream information used in the calibration step 222. At the calibration step 222, system identification is conducted that calibrates values of the real-world system (model) parameters p to the measured behavior b provided by the sensor 234, at discrete points. Once the model parameters p are known for the real-world system as it is operating (which are determined at the calibration step 222), the behavior b throughout the real-world system 230 is predicted at predictor module 223. For example, emergent behavior 236 can be projected on an augmented reality headset 224 worn by an operator to indicate sources of danger and improve decision making.

In the example implementation depicted in FIG. 2, the real-world system 230 has two serial pumps, the upper pump 231 and the lower pump 232. Under normal operation of the real-world system 230, the pumps 231 and 232 operate in tandem to pump fluid through the real-world system 230. In one example embodiment, the upper pump 231 is stopped to be replaced by a back-up pump 233 and the lower pump 232 is kept running. During such an operation, a large amount of excess fluid is automatically diverted to a bypass 235 by a smart cyber-physical control system utilizing principles of the present invention that detects the start of maintenance activity. This control system, which implements principles of the present invention, uses a priori fatigue life calculations (e.g. the simulations performed at 221) and the current high mass flow and temperature through the bypass 235 which is reported by the sensor 234, to calibrate the model at 222 and identify at predictor module 223, the stress concentration in a bypass corner that could lead to near time physical failure 236 of the bypass system 235. This behavior 236 is then visually and/or graphically illustrated to the user via the augmented reality headset 224.

Figure 3A:
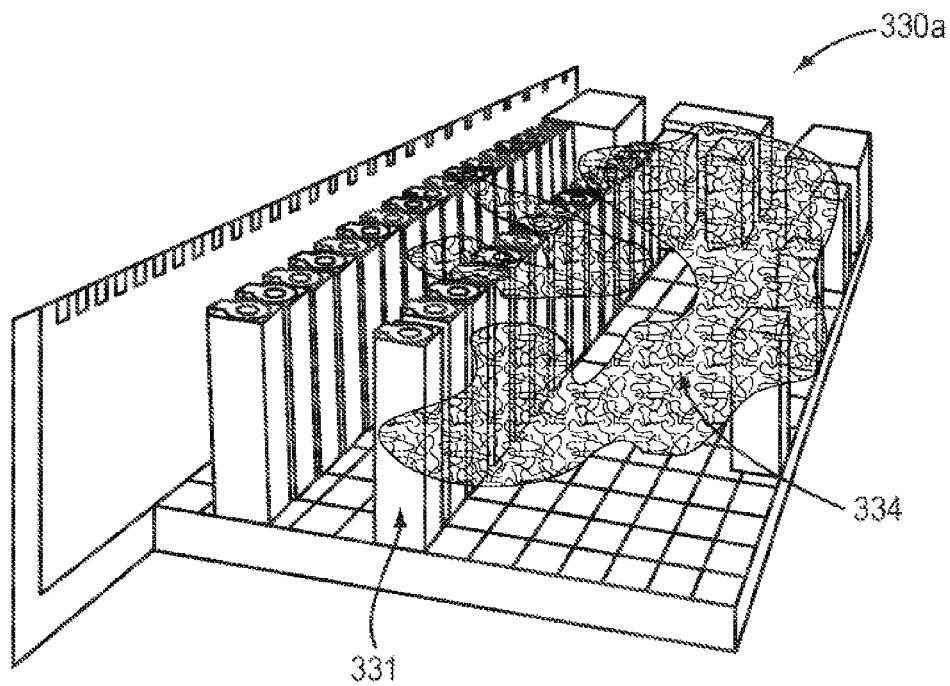
FIGS. 3A and 3B illustrate augmented realities of a real-world system that may be provided by embodiments.
Figure 3B:
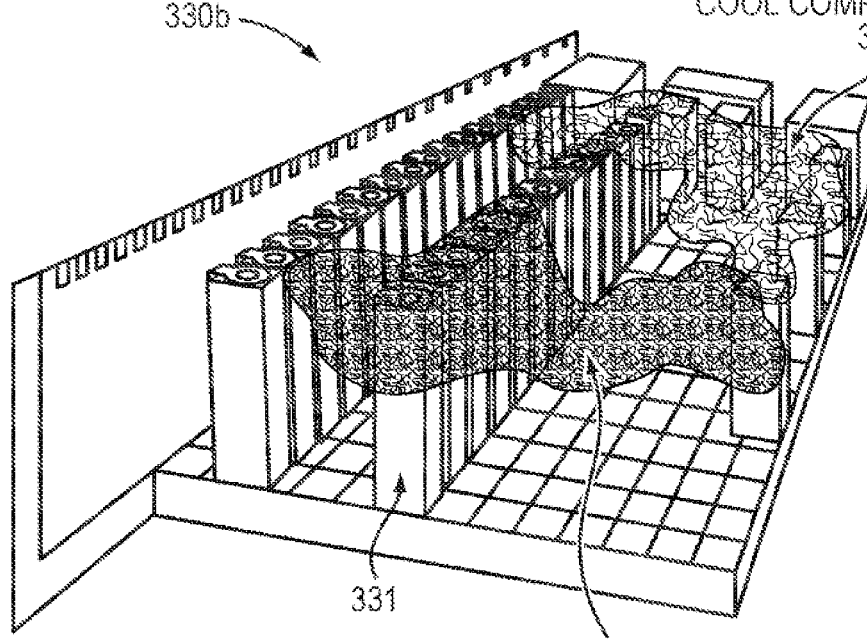

FIGS. 3A and 3B depict a data center 330a, 330b, (330 generally) at various times. The data center 330 has networked computers 331 and a computer room air conditioning (CRAC) system. Under normal operating conditions of the data center 330a, depicted in FIG. 3A, the temperature of the air around the computers 331 is stable and controlled which is illustrated, via an augmented reality provided according to principles of the present invention, with the uniform shading 334. At the point depicted in FIG. 3B, due to unforeseen external events, part of the CRAC ventilation system is compromised (such as a fan or ventilation opening). Further, processing and thermal load to the computers 331 may increase suddenly in response to this external event, causing a thermal disruption within the data center 330b. This thermal disruption is illustrated in FIG. 3B where the dark shading 332 illustrates an overloaded and overheating computer array and the lighter shading 333 depicts an under-utilized and cool computer array.

By utilizing principles of the present invention, the data center operator can be in the data center room and by utilizing an augmented reality headset, see that certain computers are overheating and can react quickly to prevent network failure. Without the augmented reality, one cannot determine the physical location of the overheating computers, the flow direction of air, and thus, how to properly balance the processing load and respond to control the compromised CRAC system. By following the process depicted in FIG. 2, the data center operator can wear the augmented reality headset, load the simulation results, and observe field data, e.g. temperature and air flow. This observed field data then allows the operator to clearly visualize the flow and thermal problem and quickly redirect processing load from location 332 to location 333. The augmented reality thus, enables improved and accelerated decisions to resulting emergent behavior. Further, in an embodiment, the augmented reality may suggest the proper step(s) to take by identifying the overloaded computers and by identifying computers that can handle additional load.

Figure 4:
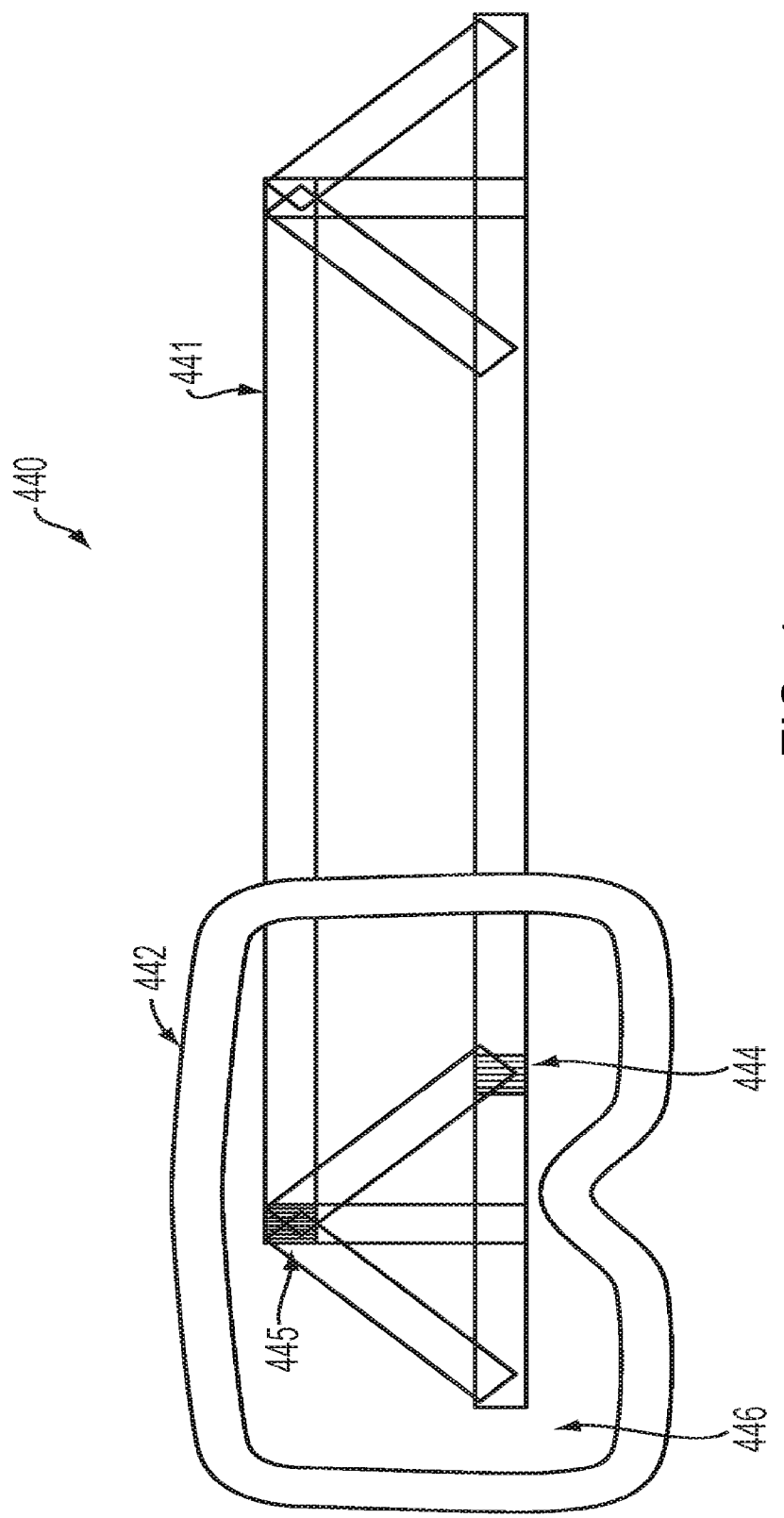
FIG. 4 depicts a real-world system with an augmented reality according to an embodiment.

FIG. 4 depicts a real-world system 440 that includes a bridge 441 where a user utilizing a holographic augmented reality headset 442 can view the augmented reality 446. In such an embodiment, a model of the bridge 441 is defined, simulations of the modeled bridge 441 are performed, and the results from said simulations are stored as described hereinabove. Then, in operation, a user goes to the bridge 441 and wears the augmented reality headset 442 which can be connected via wire or wireless connection to a computing device configured to perform the methods described herein, and the user can view the augmented reality 446 of the bridge 441. Alternatively, the computing can be performed via one or more processors of the headset 442 itself. By utilizing principles of the present invention, a user can see otherwise invisible features of the system 440. For example, in the embodiment depicted in FIG. 4, the user can view the strain on the bridge at various points, which can be visually and/or graphically illustrated, for example, using shading, 444 and 445. FIG. 4 illustrates an example where the darker shading 445 shows a point on the bridge 441 that is under higher strain than the portion with lighter shading 444.

Figure 5:
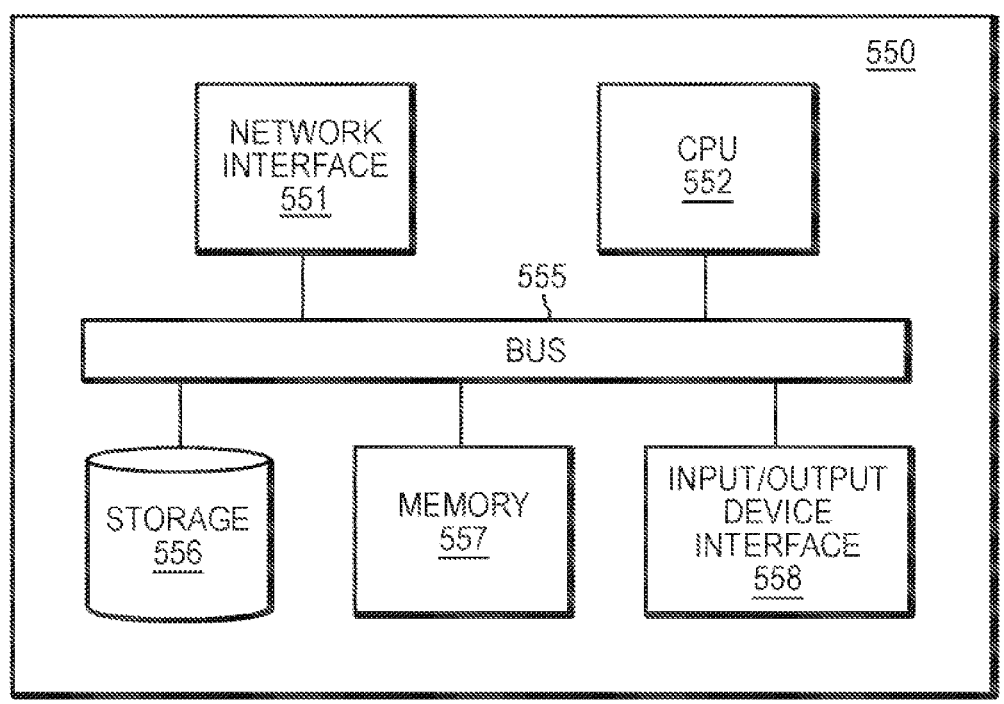
FIG. 5 is a simplified block diagram of a computer system for providing an augmented reality experience according to an embodiment.

FIG. 5 is a simplified block diagram of a computer-based system 550 version of headset, 224, 442, that may be used to provide an augmented reality experience according to an embodiment of the present invention. The computer based system 550 comprises a bus 555. The bus 555 serves as an interconnect between the various components of the system 550. Connected to the bus 555 is an input/output device interface 558 for connecting various input and output devices such as a keyboard, mouse, display, speakers, sensors, etc. to the computer based system 550. A central processing unit (CPU) 552 is connected to the bus 555 and provides for the execution of computer instructions. Memory 557 provides volatile storage for data used for carrying out computer instructions. Storage 556 provides non-volatile storage for software instructions, such as an operating system (not shown). The system 550 also comprises a network interface 551 for connecting to any variety of networks known in the art, including wide area networks (WANs) and local area networks (LANs).

It should be understood that the example embodiments described herein may be implemented in many different ways. In some instances, the various methods and machines described herein may each be implemented by a physical, virtual, or hybrid general purpose computer, such as the computer system 550, or a computer network environment such as the computer environment 660, described herein below in relation to FIG. 6. The computer system 550 may be transformed into the machines that execute the methods/modules (e.g. 100, 221, 222, 223) described herein, for example, by loading software instructions into either memory 557 or non-volatile storage 556 for execution by the CPU 552. One of ordinary skill in the art should further understand that the system 550 and its various components may be configured to carry out any embodiments of the present invention described herein. Further, the system 550 may implement the various embodiments described herein utilizing any combination of hardware, software, and firmware modules operatively coupled, internally, or externally, to the system 550.

Figure 6:
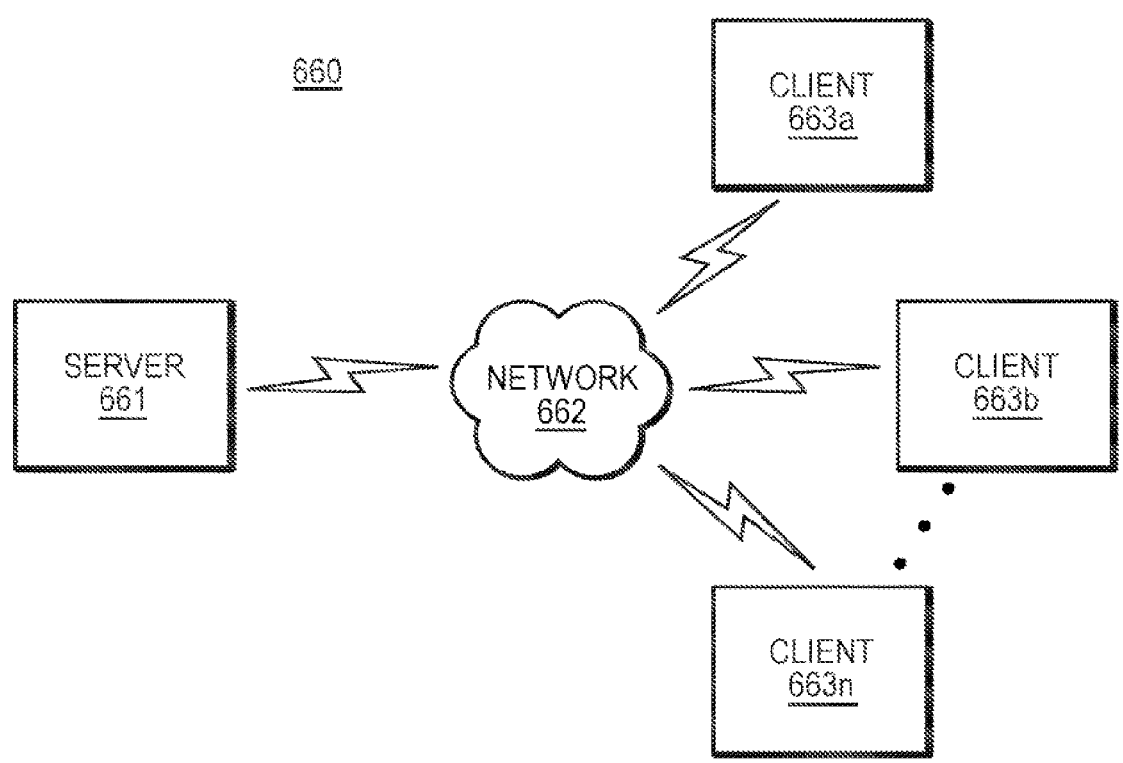
FIG. 6 is a simplified schematic diagram of a computer network environment in which an embodiment of the present invention may be implemented.

FIG. 6 illustrates a computer network environment 660 in which an embodiment of the present invention may be implemented. In the computer network environment 660, the server 661 is linked through the communications network 662 to the clients 663a-n. One or more clients 663 are configured as computer based system 550 described above. The environment 660 may be used to allow the clients 663a-n (such as headsets 224, 442), alone or in combination with the server 661, to execute any of the methods/modules (e.g. 100, 221, 222, 223) described hereinabove.

Embodiments or aspects thereof may be implemented in the form of hardware, firmware, or software. If implemented in software, the software may be stored on any non-transient computer readable medium that is configured to enable a processor to load the software or subsets of instructions thereof. The processor then executes the instructions and is configured to operate or cause an apparatus to operate in a manner as described herein.

Further, firmware, software, routines, or instructions may be described herein as performing certain actions and/or functions of the data processors. However, it should be appreciated that such descriptions contained herein are merely for convenience and that such actions in fact result from computing devices, processors, controllers, or other devices executing the firmware, software, routines, instructions, etc.

It should be understood that the flow diagrams, block diagrams, and network diagrams may include more or fewer elements, be arranged differently, or be represented differently. But it further should be understood that certain implementations may dictate the block and network diagrams and the number of block and network diagrams illustrating the execution of the embodiments be implemented in a particular way.

Accordingly, further embodiments may also be implemented in a variety of computer architectures, physical, virtual, cloud computers, and/or some combination thereof, and thus, the data processors described herein are intended for purposes of illustration only and not as a limitation of the embodiments.

While this invention has been particularly shown and described with references to example embodiments thereof, it will be understood by those skilled in the art that various changes in form and details may be made therein without departing from the scope of the invention encompassed by the appended claims.

What is claimed is:

1. A computer implemented method for providing an augmented reality experience, the method comprising:
   defining in computer memory, a model of a real-world system;
   performing a plurality of simulations of the real-world system using the defined model, each simulation of the plurality of simulations including one or more simulation input parameters for that simulation, performing each simulation of the plurality of simulations producing predicted field data for that simulation;
   storing the predicted field data and the associated one or more simulation input parameters for each simulation of the plurality of simulations;
   receiving field data from one or more sensors in the real-world system;
   calibrating the model of the real-world system using the received field data relative to the predicted field data, resulting in a calibrated model;
   providing the augmented reality experience of the real-world system using the determined values of the one or more calibrated input parameters as inputs to the calibrated model of the real-world system, the augmented reality experience including a presentation of the received field data and simulation data; and
   illustrating a state of the real-world system at a future time, wherein the state of the real-world system at a future time is determined to be the nearest failure condition to the current state of the real-world system.

2. The method of claim 1, wherein illustrating the state of the real-world system at a future time further includes using one or more counterexamples.

3. The method of claim 1, wherein calibrating the model further includes determining values of one or more calibrated simulation input parameters of the model based on the plurality of simulations and the one or more simulation input parameters associated with each of the plurality of simulations such that the output of the model minimizes differences between the field data from the one or more sensors and the predicted field data.

4. The method of claim 1 wherein defining the model of the real-world system includes defining one or more model parameters, wherein the plurality of simulations are performed for one or more variations of the one or more model parameters, the method further comprising storing the one or more variations of the one or more model parameters.

5. The method of claim 1 wherein the augmented reality is provided via an augmented reality headset.

6. The method of claim 1 further comprising:
   predicting one or more points of failure of the real-world system by performing a simulation of the real-world system using the calibrated model; and
   indicating the one or more predicted points of failure in the augmented reality.

7. The method of claim 1 further comprising performing one or more potential action simulations of the real-world system using the defined model with potential actions to identify one or more potential actions that can be taken to avoid the nearest failure condition.

8. The method of claim 7 further comprising illustrating the one or more actions that can be taken to avoid nearest failure condition.

9. The method of claim 8, wherein illustrating the one or more actions is performed in response to a user request.

10. The method of claim 7 wherein identifying one or more potential actions that can be taken to avoid the nearest failure condition further includes using one or more previously performed simulations.

11. The method of claim 1 wherein illustrating the state of the real-world system at a future time depicts at least one of:
the real-world system if no action is performed;
the real-world system if a user proposed action is performed; and
the real-world system if a system recommended action is performed.

12. The method of claim 1 wherein the performed plurality of simulations, simulates one or more emergent behaviors of the real-world system.

13. The method of claim 1 wherein the augmented reality illustrates physical field data of the real-world system determined using the calibrated model.

14. The method of claim 13 wherein the physical field data includes at least one of:
temperature;
density;
gas flow;
probable fracture location;
likelihood of fracture;
velocity;
stress; and
strain.

15. A computer system for providing an augmented reality experience, the computer system comprising:
a processor; and
a memory with computer code instructions stored thereon, the processor and the memory, with the computer code instructions being configured to cause the system to:
define in computer system memory, a model of a real-world system;
perform a plurality of simulations of the real-world system using the defined model, each simulation of the plurality of simulations including one or more simulation input parameters for that simulation, performing each simulation of the plurality of simulations producing predicted field data for that simulation;
store the predicted field data and the associated one or more simulation input parameters for each simulation of the plurality of simulations;
receive field data from one or more sensors in the real-world system;
calibrate the model of the real-world system using the received field data relative to the predicted field data, resulting in a calibrated model; and
provide the augmented reality experience of the real-world system illustrating a state of the real-world system at a future time using the determined values of the one or more calibrated input parameters as inputs to the calibrated model of the real-world system, the augmented reality experience including a presentation of the received field data and simulation data the state of the real-world system at the future time determined to be the nearest failure condition to the current state of the real-world system.

16. The system of claim 15, wherein illustrating the state of the real-world system at a future time further includes using one or more counterexamples, wherein calibrating the model further includes determining values of one or more calibrated simulation input parameters of the model based on the plurality of simulations and the one or more simulation input parameters associated with each of the plurality of simulations such that the output of the model minimizes differences between the field data from the one or more sensors and the predicted field data.

17. The system of claim 15 wherein the computer code instructions further cause the system to perform one or more potential action simulations of the real-world system using the defined model with potential actions to identify one or more potential actions that can be taken to avoid the nearest failure condition.

18. The system of claim 17 wherein the computer code instructions further cause the system to illustrate the one or more actions that can be taken to avoid nearest failure condition.

19. The system of claim 17 wherein identifying one or more potential actions that can be taken to avoid the nearest failure condition further includes using one or more previously performed simulations.

20. A non-transitory computer program product for providing an augmented reality experience, the computer program product executed by a server in communication across a network with one or more clients and comprising:
a computer readable medium, the computer readable medium comprising program instructions which, when executed by a processor causes:
defining in computer memory, a model of a real-world system;
performing a plurality of simulations of the real-world system using the defined model, each simulation of the plurality of simulations including one or more simulation input parameters for that simulation, performing each simulation of the plurality of simulations producing predicted field data for that simulation;
storing the predicted field data and the associated one or more simulation input parameters for each simulation of the plurality of simulations;
receiving field data from one or more sensors in the real-world system;
calibrating the model of the real-world system using the received field data relative to the predicted field data, resulting in a calibrated model; and
providing the augmented reality experience of the real-world system using the determined values of the one or more calibrated input parameters as inputs to the calibrated model of the real-world system, the state of the real-world system at a future time is determined to be the nearest failure condition to the current state of the real-world system.

* * * * *